United States Patent
Tarter et al.

(10) Patent No.: US 6,512,675 B1
(45) Date of Patent: Jan. 28, 2003

(54) HEAT SINK GROUNDED TO A GROUNDED PACKAGE LID

(75) Inventors: Thomas S. Tarter, Campbell, CA (US); Eric S. Tosaya, Fremont, CA (US); Tom J. Ley, Cupertino, CA (US); Shrikar Bhagath, San Jose, CA (US); Nhon T. Do, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 41 days.

(21) Appl. No.: 09/764,132

(22) Filed: Jan. 19, 2001

Related U.S. Application Data
(60) Provisional application No. 60/214,784, filed on Jun. 28, 2000.

(51) Int. Cl.$^7$ ................................................ H05K 7/20
(52) U.S. Cl. ...................... 361/714; 361/704; 361/707; 257/706; 174/15.1
(58) Field of Search ................................. 361/687–690, 361/698–700, 702–707, 709, 714–719, 721–724, 816, 818, 760, 767; 257/706–727, 659, 796, 798, 668; 165/80.2, 80.3, 80.4, 185; 174/15.1, 15.2, 16.3, 259, 268, 261, 260, 255

(56) References Cited

U.S. PATENT DOCUMENTS

| | | | | |
|---|---|---|---|---|
| 4,878,108 A | * | 10/1989 | Phelps et al. ................. | 357/8 |
| 5,018,004 A | * | 5/1991 | Okinaga et al. ............... | 357/74 |
| 5,294,826 A | * | 3/1994 | Marcantonio et al. ........ | 257/659 |
| 5,444,602 A | * | 8/1995 | Banerjee et al. ............. | 361/708 |
| 5,485,037 A | * | 1/1996 | Marrs ........................... | 257/712 |
| 5,552,635 A | * | 9/1996 | Kim et al. ..................... | 257/706 |
| 5,713,690 A | * | 2/1998 | Corbin et al. ................. | 403/270 |
| 5,804,875 A | * | 9/1998 | Remsburg et al. ........... | 257/718 |
| 5,881,944 A | * | 3/1999 | Edwards et al. ............. | 228/56.3 |
| 5,898,571 A | * | 4/1999 | Mertol ........................... | 361/704 |
| 6,051,888 A | * | 4/2000 | Dahl .............................. | 257/778 |
| 6,075,700 A | * | 6/2000 | Houghton et al. ............ | 361/704 |
| 6,087,842 A | * | 7/2000 | Parker et al. ................. | 324/763 |
| 6,144,101 A | * | 11/2000 | Akram .......................... | 257/778 |
| 6,219,238 B1 | * | 4/2001 | Andros et al. ............... | 361/704 |
| 6,351,389 B1 | * | 2/2002 | Malladi ......................... | 361/760 |

FOREIGN PATENT DOCUMENTS

| | | | | |
|---|---|---|---|---|
| JP | 404144268 A | * | 5/1992 | ............ H01L/25/00 |
| JP | 02001015186 A | * | 1/2001 | ............ H01R/4/64 |

* cited by examiner

*Primary Examiner*—Darren Schuberg
*Assistant Examiner*—Michael Datskovsky

(57) ABSTRACT

An intregrated circuit package, which has an intregrated circuit die thereto, is mounted to a system board. The ground trace of the system board is connected to the package, which has a pluality of ground leads on its surface. An electrically conductive epoxy is placed on the ground leads and adheres the package lid to the package board and ground the package lid. A heat sink is mounted to the package lid with an electrically conductive adhesive or electrically conductive slips that extend from a flange of the package lid to a flange of the heat sink to ground the heat sink.

12 Claims, 3 Drawing Sheets

HEAT SINK GROUNDED TO A GROUNDED PACKAGE LID

RELATED APPLICATIONS

This application claims priority from U.S. Provisional Application Ser. No. 60/214,784, filed Jun. 28, 2000, incorporated herein by reference.

FIELD OF THE INVENTION

The present invention relates to the packaging of an integrated circuit assembly and, more particularly, to a heat sink and package lid arrangement for an integrated circuit package.

DESCRIPTION OF RELATED ART

Package lids and heat sinks are generally used in integrated circuit assemblies. One such integrated circuit assembly is shown in FIG. 1. In FIG. 1, there is a system board 10 to which an integrated circuit package 12 is mounted. The integrated circuit package 12 includes an integrated circuit die 14. A package lid 16 (or heat spreader) is adhered to an upper surface of the package 12 to protect the integrated circuit die 14 and to act as an electromagnetic interference shield. The package lid 16 often serves to spread the heat generated by the integrated circuit die 14 over a larger area. Mounted to the package lid 16 is a heat sink 18, which is thermally coupled to the package lid 16 and serves to dissipate heat. In many conventional integrated circuit assemblies, the heat sink 18 is mounted to the lid 16 by a systems manufacturer.

As shown in FIG. 1, the system board 10 is equipped with an electrically conductive ground lead 20 and at least one more electrically conductive lead 22, which includes a connection to a power supply (not shown). In one conventional system, the ground lead 20 is electrically coupled to a conductive surface on the package 12 with an electrically conductive wire 24 or the like. Another electrically conductive lead 26 also extends from the system board to the electrically conductive surface on the package 12.

Alternatively, the heat sink 18 itself may be grounded to the system board 10 with an electrically conductive wire or the like. With this alternative, as shown in FIG. 1, a wire travels from the heat sink to the system board. As noted above, heat sinks are placed on the package lid by a systems manufacturer who may obtain heat sinks from a variety of different manufacturers. The heat sinks produced by varying manufactures may have differing sizes and shapes. As a result, system boards must have different sockets so that the different sized and shaped heat sinks can be grounded.

There are problems, however, with conventional integrated circuit package assemblies. One such problem is that, because heat sinks are normally placed on the package lid after the manufacturer of the integrated circuit package assembly has delivered the package assembly to the system manufacturer, different system board socket positions are needed for different heat sinks due to differing sizes and shapes. Another problem involves the need to ground the heat sink to the system ground, which involves wiring the heat sink to the system ground after the system board has been manufactured, thereby adding an additional step in the manufacturing process. Also, the connectors that connect the heat sink to the system ground are exposed, which can lead to breakage.

SUMMARY OF THE INVENTION

There is a need for a heat sink and package lid assembly that improves the assembly of the heat sink and package lid and reduces the risk of breakage.

These and other needs are met by embodiments of the present invention which provides an integrated circuit package assembly having a package board, an electrically grounded package lid mounted to the package board, and a heat sink mounted to the package lid and grounded only through the package lid.

The grounding of a package lid and mounting of a heat sink to the grounded package lid so as to ground the heat sink only through the package lid reduces the possibility of breakage as there are no exposed wires connecting the heat sink and the system board. Also, assembly is improved as the unit is more readily connectable to a system board. Moreover, the inventive heat sink-package lid assembly provides for a modular assembly that reduces manufacturing costs and reduces the number of parts.

Additional advantages and novel features of the invention will be set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF DESCRIPTION OF THE DRAWINGS

Preferred embodiments of the invention will be described with reference to the drawings, which are incorporated in and constitute a part of the specification, in which.

DETAILED DESCRIPTION OF THE PREFERRED EMBODIMENTS

Figure 2:
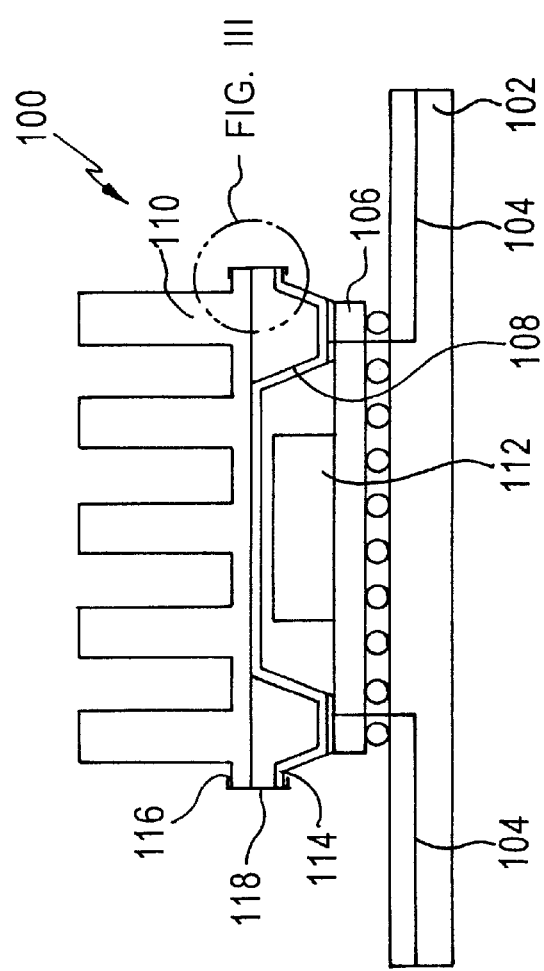
FIG. 2 is a side sectional view of a heat sink-package lid assembly according to an embodiment of the invention.

Referring now to the drawings, and initially to FIG. 2, there will be seen a heat sink and package lid assembly 100 according to a first embodiment of the invention. The assembly 100 is mounted to a system board 102 having a system ground 104, which provides a ground source to the entire system 100.

The heat sink-package assembly 100 has a package board 106, a package lid 108, and a heat sink 110. Mounted on the package board 106, and electrically connected thereto, is an integrated circuit die 112. The package lid 108 is mounted to a surface of the package board 106 and serves to physically protect the die 112 and to act as an electromagnetic interference shield.

The die 112 generates large amounts of heat that needs to be dissipated to the ambient air. The package lid 108 also acts as a heat spreader, which serves to spread the heat produced by the die 112 more evenly, rather than in a concentrated area around the die 112. A heat sink 110 is mounted on the package lid 108 and dissipates the heat conducted from the package lid 108 to the ambient air.

In certain preferred embodiments, both the package lid 108 and the heat sink 110 are grounded. In the illustrated embodiment of FIG. 2, the system ground trace 104 is electrically connected to the package board 106. The package board 106 is provided with a plurality of ground traces (not shown). An electrically conductive epoxy is placed over the ground traces to adhere the package lid 108 to the package board 106. The epoxy serves to ground the package lid 108 to the system ground trace 104.

As shown in the preferred embodiment of FIG. 2, each of the package lid 108 and the heat sink 110 are provided with flanges 114 and 116, respectively. An electrically conductive clip 118 is attached to the package lid flange 114 and the heat sink flange 116 to ground the heat sink 110 to the package lid 108. In preferred embodiments, the conductive clips 118 are tight enough for the clip 118 to reduce vibration and other movement of the heat sink 110.

Figure 1:
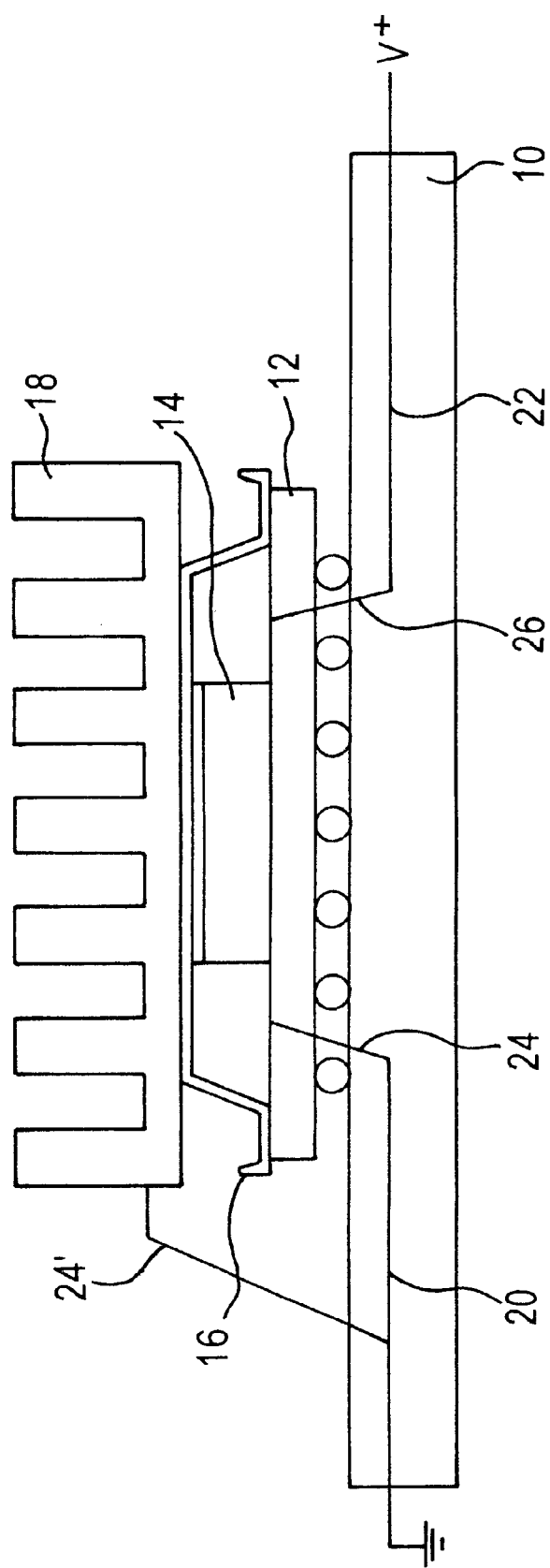
FIG. 1 is a side sectional view of a conventional system including an integrated circuit package assembly with a heat sink mounted thereto.
Figure 3:
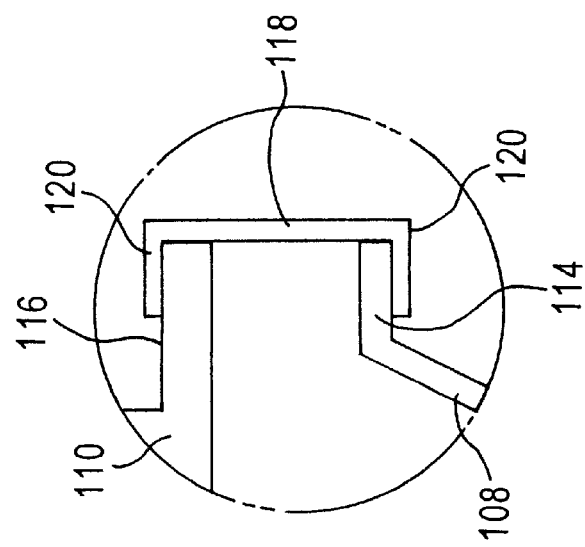
FIG. 3 is an enlarged portion of the sectional view of FIG. 2 according to an embodiment of the invention.

In the preferred embodiment of FIG. 2, each of the conductive clips 118 is spring loaded so that the ends 120 of the clips 118 snap over the flanges 114, 116 as shown in FIG. 3. To install the clips 118, the end of the clip 118 is bent upward slightly and then slid over the flange 114 or 116. The rest of the clip 118 is then pushed over the flange 114 or 116 so that the ends 120 rest on a flat surface of the flanges 114, 116 to hold the heat sink 110 firmly in place. This also establishes a good grounding connection. Each clip preferably is constructed of aluminum, which is a highly conductive and very workable material.

Figure 4:
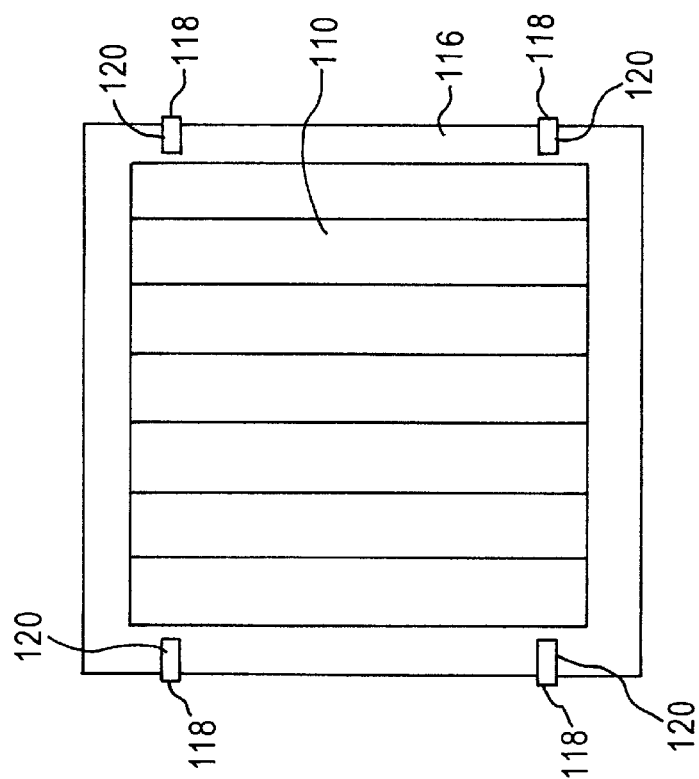
FIG. 4 is a top view of the heat sink-package lid assembly according to the embodiment of FIG. 2.

In the embodiment of FIG. 2, it is preferred that there be four conductive clips 118, which are placed two on opposite sides, as shown in FIG. 4. This provides sufficient strength to hold the heat sink 110 to the package lid 108. It is also possible to include additional clips 118 on the remaining two sides to add greater stability to the assembly 100. It is also possible to use any number of conductive clips 118 including only a single clip 118.

Rather than conductive clips, it is also contemplated to use an electrically conductive wire, strap, or some other conductive lead. Should such an alternative be used, it is possible to firmly hold the heat sink in place by soldering the strap, or other conductive lead, firmly to both flanges. With such a configuration, there are still the advantages of having a modular assembly, although there is an additional manufacturing step.

Figure 5:
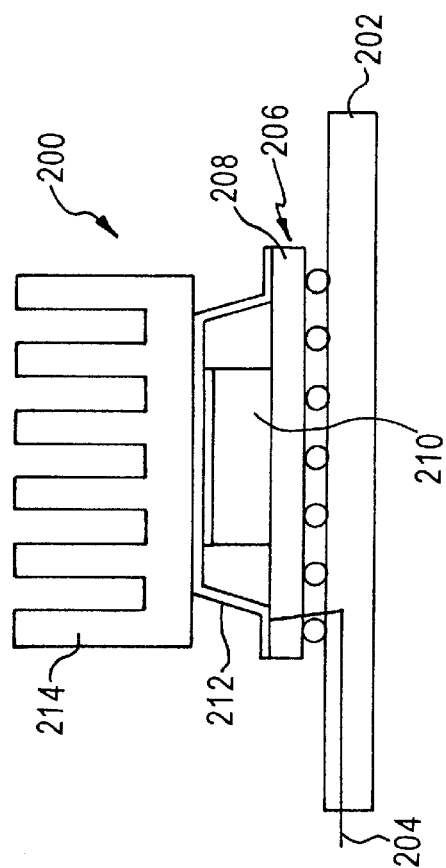
FIG. 5 is a side sectional view of a system according to another embodiment of the invention.

Another embodiment of the invention is depicted in FIG. 5. The package lid-heat sink assembly 200 has a system board 202 with a system ground trace 204 running therethrough. An integrated circuit package 206 is mounted to the system board 202. The integrated circuit package 206 includes a package board 208 and an integrated circuit die 210. The system ground trace 204 extends through the system board 202 to the package board 208. There are a plurality of ground leads (not shown) provided on the upper surface of the package board 208.

The package lid-heat sink assembly 200 is mounted to the package board 208. The assembly 200 includes a package lid 212 adhesively mounted to the package board 208 and a heat sink 214 adhesively mounted to the package lid 212. The package lid 212 serves to protect the die 210 and act as an electromagnetic interference shield. Preferably, the package lid 212 also acts as a heat spreader to spread out the heat generated by the die 210, which is then dissipated by the heat sink 214.

In this preferred embodiment, an electrically conductive epoxy is placed on the ground leads in the package board 208. The epoxy adheres the package lid 212 to the package board 208 and serves to ground the package lid 212. The heat sink 214 also preferably mounted to the package lid 212 with an electrically conductive epoxy to electrically couple the heat sink 214 to the package lid 212 and ground the heat sink 214.

An advantage of this embodiment is an increased tolerance in manufacturing the assembly. In other words, the length of the conductive clip 118 in the embodiment of FIG. 2 has to be fairly accurate because it must clamp the two flanges 114, 116 together. Moreover, it is important that the flanges 114, 116 be strong enough to withstand the pressure applied by the ends 120 of the conductive clips 118. In the embodiment of FIG. 5, the assembly 200 is readily formed, because it only needs to be ensured that the adhesive is placed appropriately between the package lid 212 and the heat sink 214.

In the illustrated embodiments, the package lid 108 and the heat sink 110 are made from aluminum. Aluminum is preferred because of its cost, weight, workability, and heat dissipating characteristics. On the other hand, other thermally and electrically conductive materials are employed in other embodiments of the invention.

By electrically coupling a heat sink to a grounded package lid in a packaging assembly, the present invention provides an arrangement that grounds a heat shield with a reduced risk of breaking the ground connection. Also, manufacturing is improved as wiring from the heat sink to a circuit board is avoided. Additionally, the inventive assembly provides for a modular assembly which alleviates the need for a systems manufacturer to assemble the heat sink and package lid.

While this invention has been described in connection with what is presently considered to be the most practical and preferred embodiments, it is to be understood that the invention is not limited to the disclosed embodiments, but, on the contrary, is intended to cover various modifications and equivalent arrangements included within the scope of the appended claims.

What is claimed is:

1. An integrated circuit package assembly comprising:
   a package board;
   an electrically grounded package lid mounted to the package board, the package lid having a first flange surrounding the package lid at a peripheral end thereof;
   a heat sink mounted to the package lid and grounded only through the package lid, the heat sink having a second flange surrounding the heat sink at a peripheral thereof; and
   a spring loaded electrically conductive clip having a first end and a second end, the clip being configured to hold the heat sink firmly to the package lid via a tension of the clip provided by the spring loading when the first end of the clip is positioned over a portion of the peripheral end of the heat sink to rest on a portion of the second flange while the second end of the clip is positioned over a portion of the peripheral end of the package lid to rest on a portion of the first flange, the clip grounding the heat sink via the connection to the package lid.

2. The integrated circuit package assembly as claimed in claim 1, wherein the conductive clip comprises aluminum.

3. The integrated circuit package assembly as claimed in claim 1, further comprising an electrically conductive adhesive between the package lid and the package board to mount the package lid to the package board.

4. The integrated circuit package assembly as claimed in claim 3, wherein the electrically conductive adhesive is thermally conductive.

5. The integrated circuit package assembly as claimed in claim 4, wherein the package lid is configured to spread heat produced by the package and transfer the heat produced to the heat sink.

6. The integrated circuit package assembly as claimed in claim 5, wherein the package lid includes aluminum.

7. The integrated circuit package assembly as claimed in claim 5, wherein the heat sink includes aluminum.

8. A system comprising:
- a system board having a system ground;
- an integrated circuit package mounted to a system board and including an integrated circuit die;
- a heat spreader mounted to the package to cover the integrated circuit die and grounded to the system ground, the heat spreader having a first flange surrounding the heat spreader at a peripheral end thereof;
- a heat sink mounted to the heat spreader and connected to ground only through the heat spreader, the heat sink having a second flange surrounding the heat sink at a peripheral end thereof; and
- a spring loaded clip having a first end and a second end, the clip being configured to hold the heat sink firmly to the heat spreader via a tension of the clip provided by the spring loading when the first end of the clip is positioned over a portion of the peripheral end of the heat sink to rest on a portion of the second flange while the second end of the clip is positioned over a portion of the peripheral end of the heat spreader to rest on a portion of the first flange.

9. The system as claimed in claim 8, further comprising an electrically conductive adhesive between the heat spreader and the package to mount the heat spreader to the package.

10. The system as claimed in claim 8, wherein the heat spreader and heat sink comprise aluminum.

11. The integrated circuit package assembly as claimed in claim 8, wherein the conductive clip comprises aluminum.

12. An integrated circuit package assembly comprising:
- an electrically grounded package lid, the package lid having a first flange surrounding the package lid at a peripheral end thereof;
- a heat sink, the heat sink having a second flange surrounding the heat sink at a peripheral thereof; and
- a spring loaded electrically conductive clip coupled to the package lid and the heat sink to electrically couple the heat sink to the package lid and thereby ground the heat sink and to fix the heat sink and package lid together, the clip having a first end and a second end and configured to hold the heat sink firmly to the package lid via a tension of the clip provided by the spring loading when the first end of the clip is positioned over a portion of the peripheral end of the heat sink to rest on a portion of the second flange while the second end of the clip is positioned over a portion of the peripheral end of the package lid to rest on a portion of the first flange, the clip grounding the heat sink via the connection to the package lid.

* * * * *